(12) United States Patent
Anderson et al.

(10) Patent No.: US 6,246,278 B1
(45) Date of Patent: Jun. 12, 2001

(54) HIGH SPEED SINGLE PHASE TO DUAL PHASE CLOCK DIVIDER

(75) Inventors: Michael B. Anderson; Kenneth C. Schmitt, both of Colorado Springs; David M. Weber, Monument, all of CO (US)

(73) Assignee: LSI Logic Corporation, Milpitas, CA (US)

( * ) Notice: Subject to any disclaimer, the term of this patent is extended or adjusted under 35 U.S.C. 154(b) by 721 days.

(21) Appl. No.: 08/580,036

(22) Filed: Dec. 22, 1995

(51) Int. Cl.$^7$ ...................................................... G06F 1/04
(52) U.S. Cl. ........................ 327/295; 327/233; 327/257; 327/259
(58) Field of Search ........................ 327/231, 233, 327/256, 257, 258, 259, 291, 295

(56) References Cited

U.S. PATENT DOCUMENTS

| | | | |
|---|---|---|---|
| 3,927,334 | 12/1975 | Callahan | 327/292 |
| 3,961,269 | 6/1976 | Alvarez, Jr. | 327/239 |
| 4,130,768 | 12/1978 | Bula et al. | 326/88 |
| 4,417,158 | * 11/1983 | Ito et al. | 327/295 |
| 4,456,837 | 6/1984 | Schade, Jr. | 327/259 |
| 4,656,368 | 4/1987 | McCombs et al. | 327/203 |
| 4,950,920 | 8/1990 | Hara et al. | 327/257 |
| 5,047,659 | 9/1991 | Ullrich | 327/259 |
| 5,173,618 | 12/1992 | Eisenstadt | 327/239 |
| 5,341,031 | 8/1994 | Kinoshita et al. | 327/259 |
| 5,444,405 | 8/1995 | Truong et al. | 327/239 |
| 5,519,344 | * 5/1996 | Proebsting | 327/108 |
| 5,589,786 | * 12/1996 | Bella et al. | 327/108 |

FOREIGN PATENT DOCUMENTS

| | | | |
|---|---|---|---|
| 59-97222 | * 6/1984 | (JP) | 327/295 |
| 1-117516 | * 5/1989 | (JP) | 327/295 |

OTHER PUBLICATIONS

Bahr et al, IBM Technical Disclosure Bulletin, vol. 22, No. 7, Dec. 1979.*
Jiren Yuan, et al.; High–Speed CMOS Circuit Technique, Feb., 1989, 61–70.
Yuan Ji–Ren, et al., A True Single–Phase–Clock Dynamic, Oct., 1987, 899–901.
Morteza Afghahi, et al., A Unified Single–Phase Clocking Scheme for VLSI Systems, Feb. 1990, 225–233.

* cited by examiner

Primary Examiner—Kenneth B. Wells

(57) ABSTRACT

A dual-phase clock divider circuit provides the ability to generate high speed complementary clocks with low skew. The dual-phase clock divider circuit runs off a single clock input, such as provided by a high speed VCO. This eliminates the effect of clock skew in the highest speed portion of the circuit. The dual-phase clock divider then generates complementary outputs of low skew to be used by other clocked elements.

2 Claims, 5 Drawing Sheets

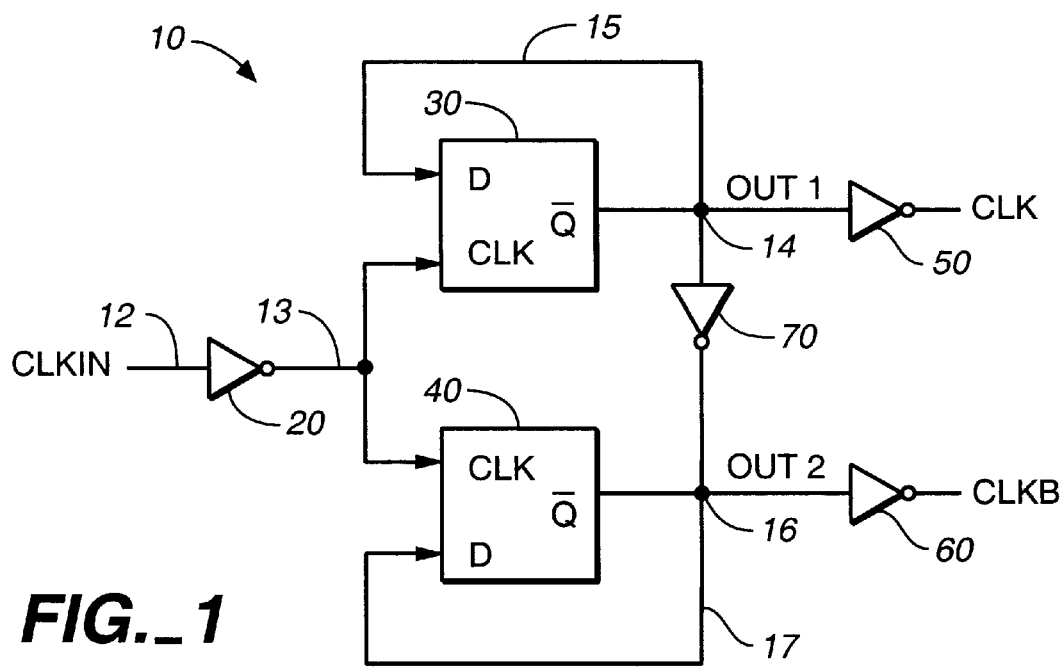
FIG._1
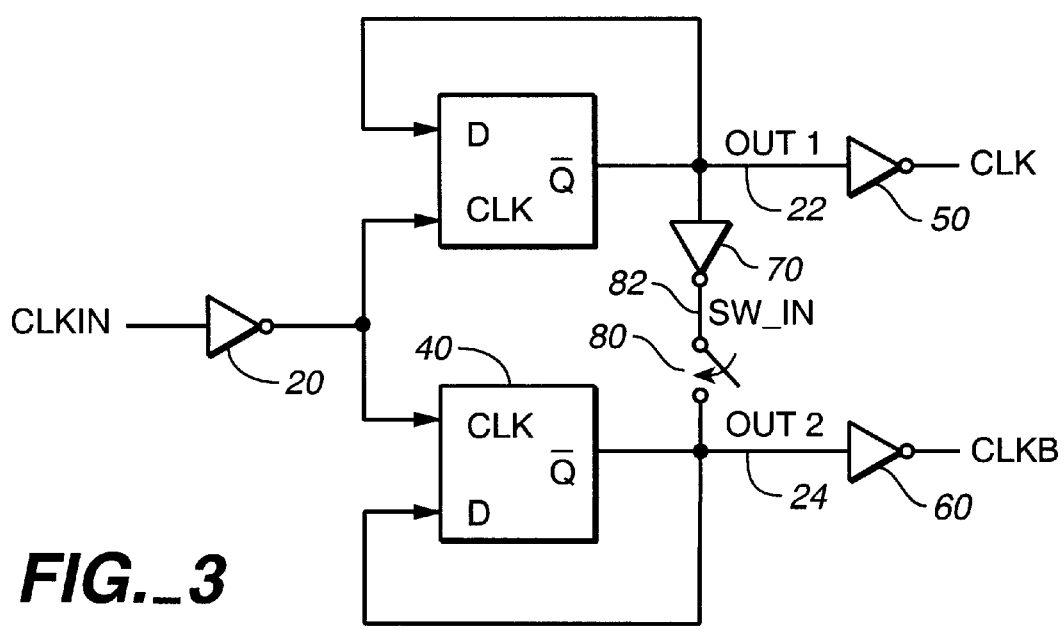
FIG._3

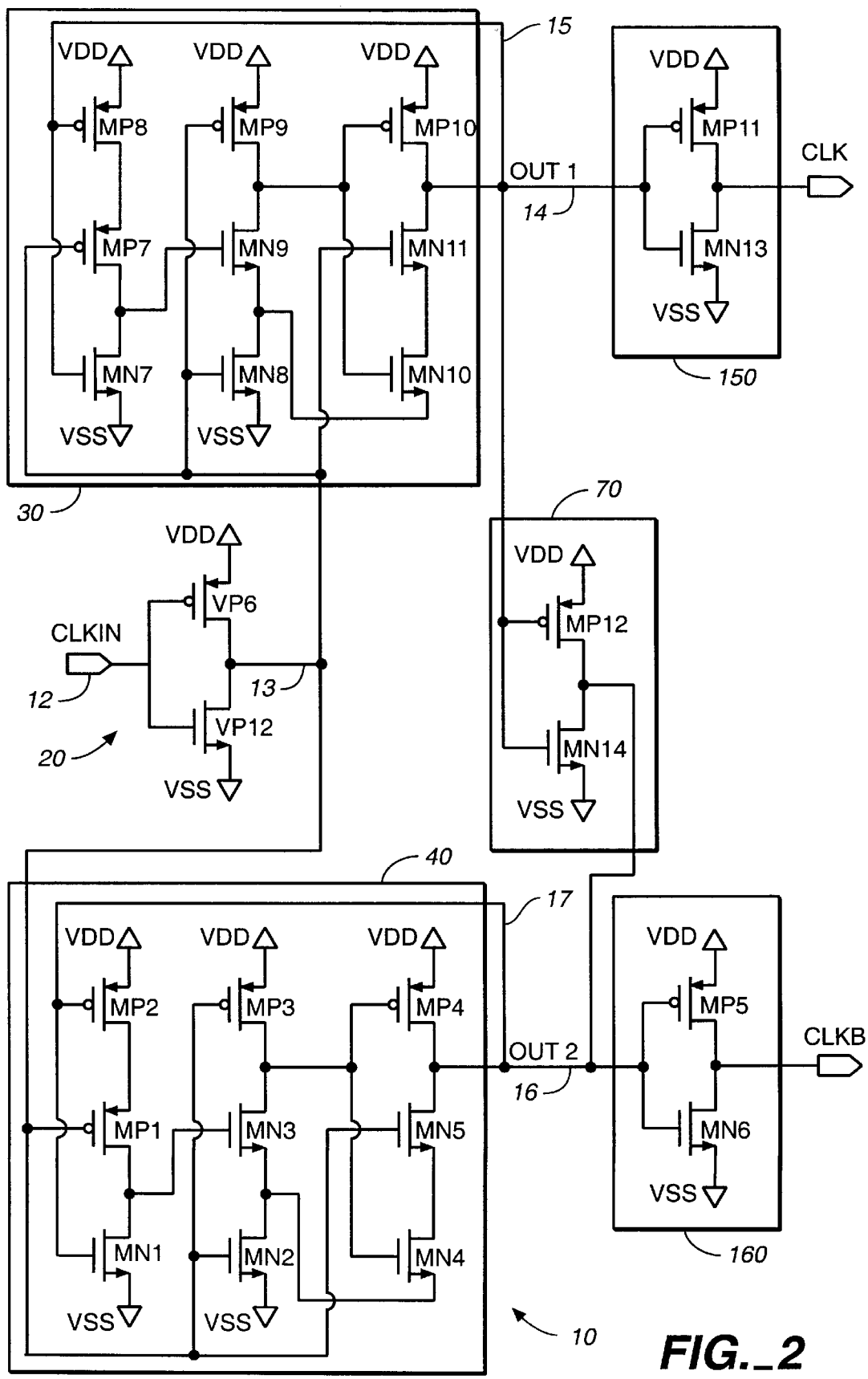
FIG._2

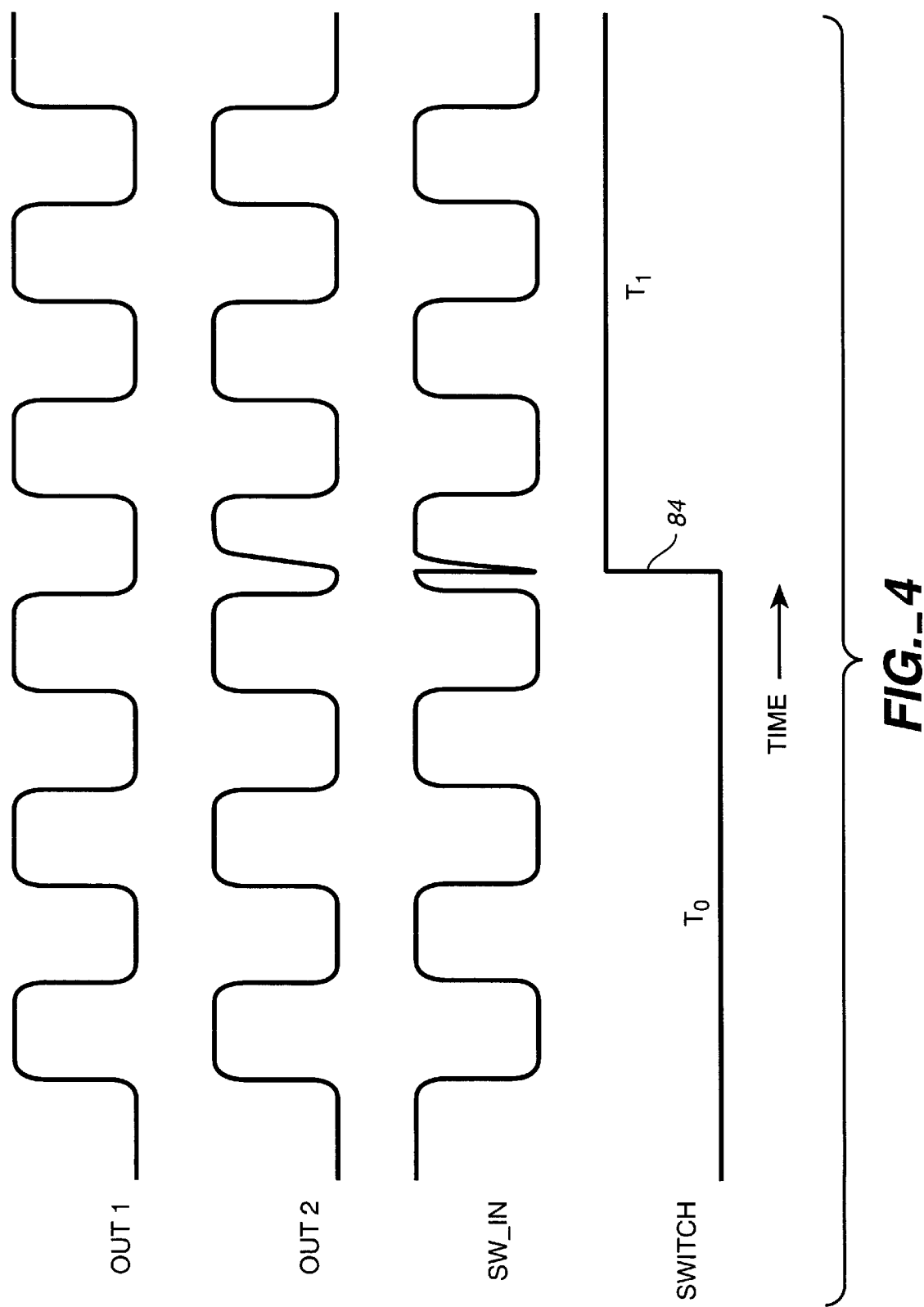

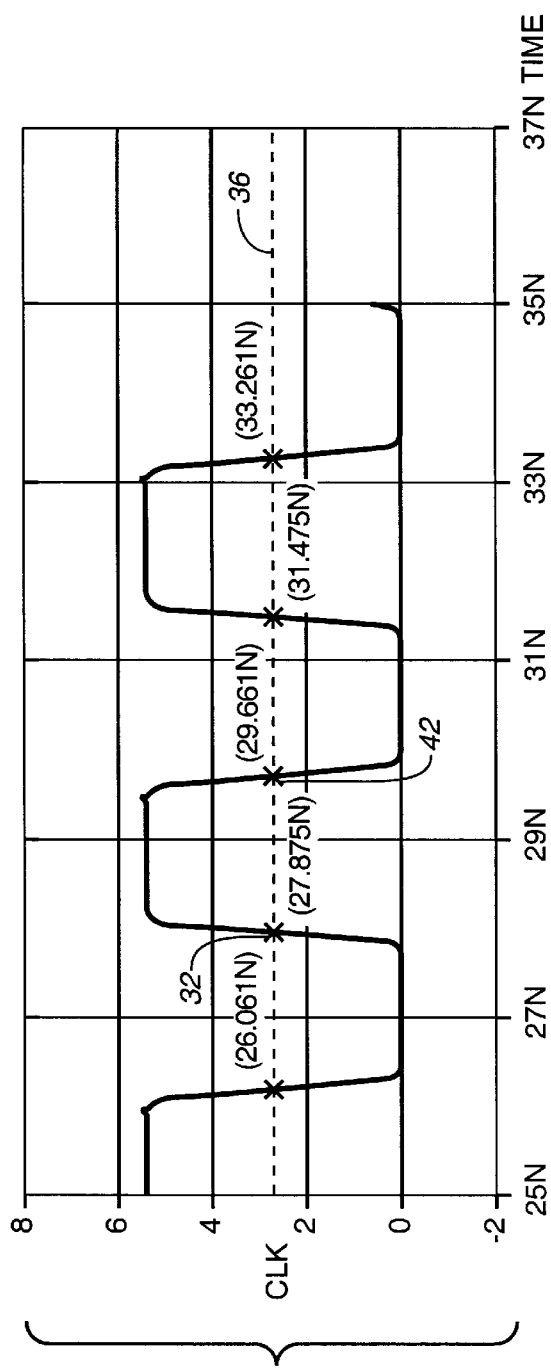
FIG._5A
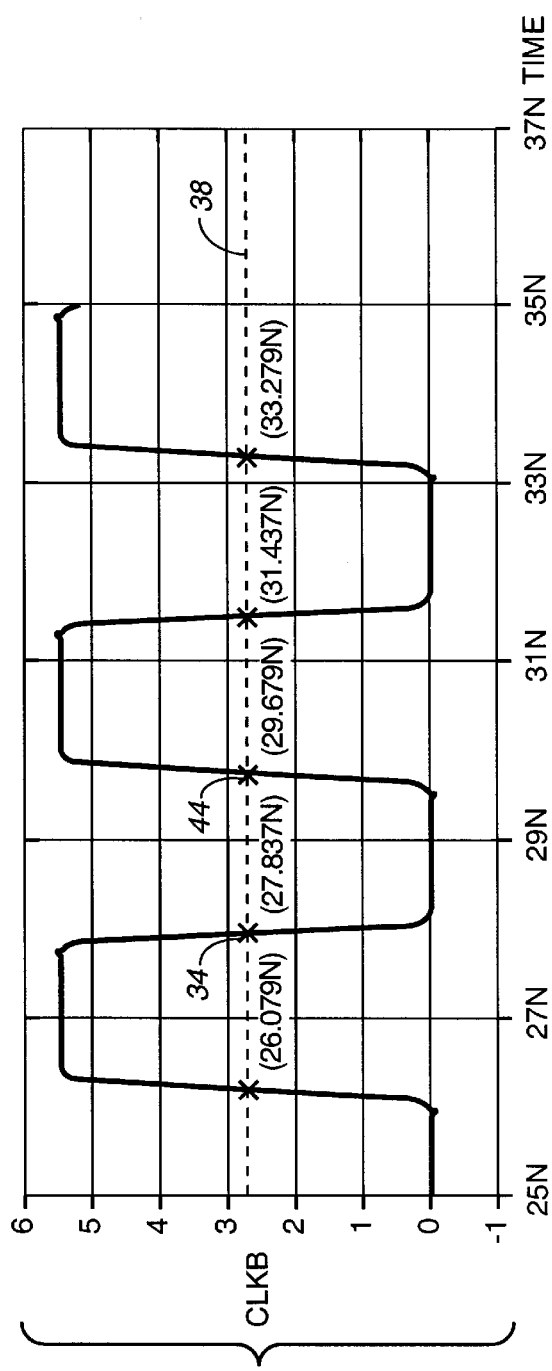
FIG._5B

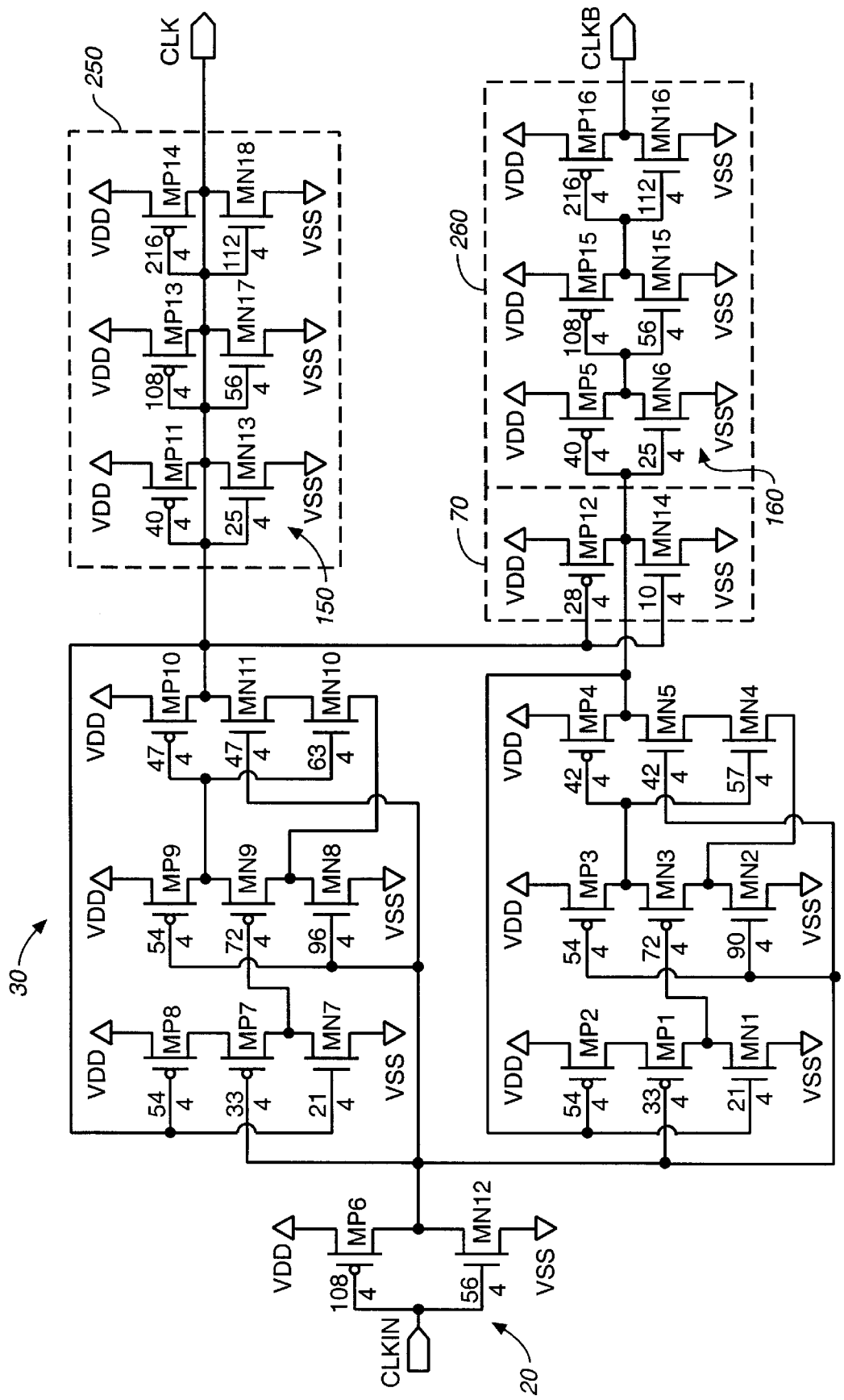
FIG._6

HIGH SPEED SINGLE PHASE TO DUAL PHASE CLOCK DIVIDER

TECHNICAL FIELD

The present invention relates to electrical circuitry, and more particularly to a clock circuit for use in high speed applications.

BACKGROUND OF THE INVENTION

In high speed circuits, complementary clocking signals are often used to improve the performance of clocked elements (i.e. flip-flops, latches, etc.). Prior approaches to generating complementary clocks used two dividers with the output of the first being inverted and fed into the input of the second. This approach is performance limited by the fact that sufficient setup time is required into the second stage divider before another clock pulse can be received.

At very high speeds, clock skew between complementary clock signals becomes a significant performance issue in clocked elements.

It is an object of the present invention to provide a means for generating high speed complementary clock signals from a single clock input.

It is another object of the present invention to provide a circuit that uses dynamic clocked elements.

It is yet another object of the present invention to provide a clock recovery circuit that eliminates an inverted feedback path.

SUMMARY OF THE INVENTION

A dual-phase clock divider circuit provides the ability to generate high speed complementary clocks with low skew. The dual-phase clock divider circuit runs off a single clock input, such as provided by a high speed VCO. This eliminates the effect of clock skew in the highest speed portion of the circuit. The dual-phase clock divider then generates complementary outputs of low skew to be used by other clocked elements.

The invention achieves the above stated objectives by eliminating the traditional approach of inverted feedback paths and clumsy signal splitting methods. The operational speed of the circuit is therefore limited mainly by the technology used to implement the design, rather than the specific circuit structure in prior approaches. This invention has wide usage applicability in high speed circuitry where setup/hold times and clock skew are of major concern.

BRIEF DESCRIPTION OF THE DRAWING

FIG. 1 is a schematic of a dual phase clock divider circuit.

FIG. 2 is a detailed schematic of the circuit shown in FIG. 1.

FIG. 3 is a circuit model for describing system start-up/power-on operations.

FIG. 4 is a timing diagram of the circuit model of FIG. 3.

FIG. 5 is a timing diagram showing clock skew between CLK and CLKB.

FIG. 6 is a detailed schematic of the circuit shown in FIG. 1, which includes transistor ratio values.

DETAILED DESCRIPTION OF THE PREFERRED EMBODIMENT

Referring now to FIG. 1 of the preferred embodiment, a dual-phase clock divider circuit is shown at 10. A CLKIN signal 12 is input to an inverting buffer 20. The output 13 of buffer 20 is coupled to the CLK inputs of blocks 30 and 40. Blocks 30 and 40 are dynamic clocked flip-flops. These are common flip-flops known in the art. It should be noted that the respective output nodes OUT1 (shown at 14) and OUT2 (shown at 16) are fed back at 15 and 17 to the inputs of the respective flip-flops, thus creating a divide by two functions. Blocks 50 and 60 represent buffering stages which provide sufficient drive capabilities for output nodes CLK and CLKB. One of the particularly advantageous parts of this invention lies in the booster circuitry contained within block 70. The booster circuit 70 allows the two dynamic clocked flip-flops 30 and 40 to initialize in an out of phase condition, which results in the complementary output clocks CLK and CLKB. The booster is also designed to be non-intrusive in the normal operation of the dynamic flip-flops, so as to preserve duty cycle and high speed performance characteristics.

Referring now to FIG. 2, the detailed schematic for blocks 30, 40 and 70 are shown. Blocks 30 and 40 are standard clocked flip-flops, and need no further description. Booster circuit 70 provides an inverter function. Booster circuit 70 is also particularly advantageous in that the inverter is non-intrusive during normal circuit operation, and merely provides a 'boost' during circuit start-up/power-on. This non-intrusive inverter operation is achieved by the relative sizes of the booster inverter transistors with respect to the transistors coupled to the booster inverter. In the preferred embodiment (as shown in FIG. 6), the p-channel transistor MP12 of booster circuit 70 has a 20/4 width-to-length ratio and the n-channel transistor MN14 of booster circuit 70 has a 10/4 width-to-length ratio. The booster inverter 70 is coupled to buffer 160. The p-channel transistor MP5 of buffer 60 has a 40/4 width-to-length ration, and the n-channel transistor MN6 of buffer 160 has a 25/4 width-to-length ratio. Because of the relatively small transistor sizes of booster circuit 70, this circuit normally operates in a substantially non-intrusive manner, and its key contribution to the clock circuit is during start-up/power-on, as will now be described.

A circuit model for start-up/power-on is shown in FIG. 3. FIG. 3 shows substantially the same circuit as that shown in FIG. 1, except for switch 80. With switch 80 open (as shown), the CLK and CLKB outputs have an undefined relationship with respect to one another, as the initial input data values at the D inputs are not necessarily the same value, and hence the Q output values being generated by the flip flops in response to clocking the flip flop' CLK input have an unknown relationship with respect to each other. For ease in understanding, it is assumed that the D inputs are at substantially the same voltage value at start-up, and hence the OUT1 signal 22 and the OUT2 signal 24 are in-phase with respect to one another, as shown during time $t_0$ in FIG. 4. The SW_IN signal 82 is also shown in FIG. 4, and is the inversion of the OUT1 signal.

Thus, the output clock signals during time $t_0$ are how the clock divider circuit of FIG. 1 would operate if booster circuit 70 was not included as a part of the clock divider circuit.

The start-up operation of the clock divider with the booster inverter is modeled by closing switch 80 of FIG. 3. The resulting switch closure is shown at 84 of FIG. 4. As can be seen, closing switch 84 causes OUT2 to be the inversion of OUT1, due to booster circuit 70, which performs an invert operation. Thus, the start-up/power-on condition, when booster circuit is included as part of the two phase clock divider circuit, results in OUT1 and OUT2 being out-ofphase with respect to one another. This out-of-phase start-up is then maintained through the normal feedback of the Q outputs to the D inputs of the respective latches 30 and 40. As described above, the booster circuit 70 is designed to be non-intrusive, and hence does not result in generating skews between the two clocks during normal operation. In effect, the booster circuit 'kick-starts' the clock circuit to have two clocks running out-of-phase or complementary with respect to each other, and then is of no consequence. This is possible due to the relatively small transistor sizes used in the booster circuit, which allows the booster to substantially impact circuit operation during start-up, but to not substantially impact circuit operation after start-up.

Thus, two complementary clocks are provided without having the second clock signal generated by an inverter, with its inherent skew introduction. This is particularly advantageous in high speed circuit operation, where two clocks out-of-phase with respect to one another are required with minimal skew between such out-of-phase clocks. The graphs shown in FIG. 5 indicate a relative skew between CLK and CLKB of less than 40 psec ($40 \times 10^{-12}$ seconds). The relative skew is defined to be the difference in time between when a rising/falling CLK signal is at its midway point, and when a falling/rising CLKB signal is at its midway point. For example, in viewing FIG. 5, the CLK signal is shown to be at a rising midway point at 32. The midway point for CLK is indicated by the dashed line 36. The time of such occurrence is 27.875 nsec (i.e. $27.875 \times 10^{-9}$ seconds). Similarly, the CLKB signal is shown to be at a corresponding falling midway point at 34. The midway point for CLKB is indicated by the dashed line 38. The time of such occurrence is 27.837 nsec i.e. $28.837 \times 10^{-9}$ seconds). The relative skew is the absolute difference between such times, and is thus 27.875 nsec minus 27.837 nsec, which equals 0.038 nsec, or 38 psec ($38 \times 10^{-12}$ seconds). It can be seen that the relative skew when the CLK signal is falling and the CLKB signal is rising is determined with respect to points 42 and 44, and is the absolute value of 29.661 nsec minus 29.679 nsec, which equals 0.018 nsec (or 18 psec).

As transistor sizing of the booster inverter is key to allow non-intrusive booster operation except during start-up, all the relative transistor size ratios for the clock circuit 10 are shown in FIG. 6. The upper number for each transistor (e.g. MN1, MN2, MP1, MP2, etc) is the relative width, and the lower number for each transistor is the relative length. For example, looking at input buffer 20, which comprises p-channel transistors MP6 and n-channel transistor MN12, the MP6 transistor has a width-to-length ratio of 108/4, and the MN12 transistor has a width-to-length ratio of 56/4. These relative lengths and widths are also shown below in Table 1.

TABLE 1

| TRANSISTOR | REL WIDTH | REL LENGTH |
| --- | --- | --- |
| MP1 | 33 | 4 |
| MP2 | 54 | 4 |
| MP3 | 54 | 4 |
| MP4 | 42 | 4 |
| MP5 | 40 | 4 |
| MP6 | 108 | 4 |
| MP7 | 33 | 4 |
| MP8 | 54 | 4 |
| MP9 | 54 | 4 |
| MP10 | 47 | 4 |
| MP11 | 40 | 4 |
| MP12 | 20 | 4 |

TABLE 1-continued

| TRANSISTOR | REL WIDTH | REL LENGTH |
| --- | --- | --- |
| MP13 | 108 | 4 |
| MP14 | 216 | 4 |
| MP15 | 108 | 4 |
| MP16 | 216 | 4 |
| MN1 | 21 | 4 |
| MN2 | 90 | 4 |
| MN3 | 72 | 4 |
| MN4 | 57 | 4 |
| MN5 | 42 | 4 |
| MN6 | 25 | 4 |
| MN7 | 21 | 4 |
| MN8 | 96 | 4 |
| MN9 | 72 | 4 |
| MN10 | 63 | 4 |
| MN11 | 47 | 4 |
| MN12 | 56 | 4 |
| MN13 | 25 | 4 |
| MN14 | 10 | 4 |
| MN15 | 56 | 4 |
| MN16 | 112 | 4 |
| MN17 | 56 | 4 |
| MN18 | 112 | 4 |

Also shown in FIG. 6 is the preferred embodiment for output drivers 50 and 60 shown in FIG. 1. Element 250 of FIG. 6 corresponds to element 50 of FIG. 1, and element 260 of FIG. 6 corresponds to element 60 of FIG. 1. It can be seen that circuits 150 and 160 (which are also shown in FIG. 2) have additional stages to provide adequate signal drive. In particular, output buffer 250 includes three stages. The first stage is shown at 150, and includes transistors MP13 and MN17. The second stage includes transistors MP14 and MN18, and the third stage includes transistors MP15 and MN18. Similarly, output buffer 260 includes three stages. The first stage is shown at 160, and includes transistors MP15 and MN16. The second stage includes transistors MP15 and MN15, and the third stage includes transistors MP16 and MN16. These stages are advantageous in gradually increasing transistor sizes from the first stage to the third stage. The first stage has transistors sized to efficiently couple to the booster circuit transistors (i.e. relatively small), whereas the third stage has transistors sized to provide adequate signal drive capability, as the dual-phase clock signals CLK and CLKB must drive many other circuits (not shown). Similarly, the second stage has transistors sized to efficiently couple the first stage to the third stage.

While I have illustrated and described the preferred embodiments of our invention, it is to be understood that I do not limit myself to the precise constructions herein disclosed, and the right is reserved to all changes and modifications coming within the scope of the invention as defined in the appended claims.

We claim:

1. In combination:

a first circuit having a first data input, a first clock input, and a first output;

a second circuit having a second data input, a second clock input, and a second output; and a third circuit having a third input and a third output, wherein the first output is coupled to the first data input and the third input, and the second output is coupled to the second data input and the third output.

2. The circuit of claim 1, wherein a clock signal is coupled to the first clock input and second clock input.

* * * * *